United States Patent
Lee et al.

(10) Patent No.: US 7,452,809 B2
(45) Date of Patent: Nov. 18, 2008

(54) FABRICATION METHOD OF PACKAGING SUBSTRATE AND PACKAGING METHOD USING THE PACKAGING SUBSTRATE

(75) Inventors: Moon-chul Lee, Yongin-si (KR); Woon-bae Kim, Suwon-si (KR); Jun-sik Hwang, Yongin-si (KR); Chang-youl Moon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 395 days.

(21) Appl. No.: 11/240,771

(22) Filed: Oct. 3, 2005

(65) Prior Publication Data

US 2006/0094158 A1 May 4, 2006

(30) Foreign Application Priority Data

Oct. 28, 2004 (KR) .................... 10-2004-0086676

(51) Int. Cl.
  *H01L 21/44* (2006.01)
  *H01R 43/00* (2006.01)
(52) U.S. Cl. ....................... 438/675; 29/825
(58) Field of Classification Search ............... 438/666, 438/667, 674, 675
  See application file for complete search history.

(56) References Cited

U.S. PATENT DOCUMENTS

| 4,356,374 | A  | * | 10/1982 | Noyori et al. | ............... 438/118 |
|---|---|---|---|---|---|
| 5,037,782 | A  | * | 8/1991 | Nakamura et al. | .......... 438/167 |
| 6,215,114 | B1 | * | 4/2001 | Yagi et al. | .................... 250/216 |
| 6,399,479 | B1 | * | 6/2002 | Chen et al. | ................... 438/628 |
| 7,030,021 | B2 | * | 4/2006 | Han | ........................... 438/694 |
| 7,070,687 | B2 | * | 7/2006 | Chikarmane et al. | ........ 205/123 |
| 7,094,701 | B2 | * | 8/2006 | Umemoto et al. | ........... 438/706 |
| 7,169,705 | B2 | * | 1/2007 | Ide et al. | ..................... 438/678 |
| 7,172,962 | B2 | * | 2/2007 | Okayama et al. | ............ 438/625 |
| 7,199,044 | B2 | * | 4/2007 | Ohtsuka et al. | ............. 438/627 |
| 2002/0083586 | A1 | * | 7/2002 | Iijima et al. | ................... 29/847 |
| 2003/0039106 | A1 | * | 2/2003 | Koyanagi et al. | ........... 361/748 |
| 2003/0100181 | A1 | * | 5/2003 | Park et al. | .................... 438/639 |
| 2004/0077154 | A1 |   | 4/2004 | Nagarajan et al. | |
| 2004/0232802 | A1 | * | 11/2004 | Koshido | ..................... 310/348 |
| 2006/0172533 | A1 | * | 8/2006 | Sun et al. | .................... 438/675 |

* cited by examiner

*Primary Examiner*—Scott B Geyer
(74) *Attorney, Agent, or Firm*—Sughrue Mion, PLLC

(57) ABSTRACT

A fabrication method of a packaging substrate includes the steps of: forming a recess by etching a predetermined area of a lower surface of a substrate; depositing a seed layer on an upper surface of the substrate; in the recess, etching predetermined area(s) of the lower surface of the substrate and forming at least one via hole that reaches the seed layer; and plating the inside of the via hole by using the seed layer, and forming electrode(s) for electrically coupling the upper and lower parts of the substrate. First and second pads coupled to the electrode(s) may be formed on the upper and lower parts of the substrate, respectively. Thus, using the second pads as bonding materials, the packaging process becomes easier, which resultantly simplifies the fabrication process of the packaging substrate and the packaging process.

12 Claims, 6 Drawing Sheets

FABRICATION METHOD OF PACKAGING SUBSTRATE AND PACKAGING METHOD USING THE PACKAGING SUBSTRATE

CROSS-REFERENCE TO RELATED APPLICATIONS

This application claims priority under 35 U.S.C. § 119 from Korean Patent Application No. 2004-86676, filed on Oct. 28, 2004, the entire content of which is incorporated herein by reference.

BACKGROUND OF THE INVENTION

1. Field of the Invention

The present invention relates in general to a fabrication method of a packaging substrate for use in circuit element packaging and a packaging method using the packaging substrate. More specifically, the present invention relates to a fabrication method of a packaging substrate where a via hole is formed in a lower surface of the substrate through an etching process to simplify the fabrication, resulting in an improved yield, and a packaging method using the packaging substrate.

2. Description of the Related Art

Technical advances in MEMS (Micro Electro Mechanical Systems) in recent years have brought the development of small, intelligent circuit elements. Before the circuits are fabricated to one single chip, they go through a 'packaging' process. The circuit element packaging is an encapsulation, hermetically sealing a circuit to make sure that the circuit is protected from foreign substances and external shocks, so that the circuit can maintain its high physical performance and configuration ready to be mounted on an electronic component.

For the encapsulation, a packaging substrate is prepared. The packaging substrate is then bonded with a base substrate mounted with a circuit element. In order for the circuit element to be electrically coupled to an external circuit, the packaging substrate must have an electrode that can be electrically coupled to an internal circuit.

In general, manufacturers of packaging substrates formed a via hole connecting the upper and lower surfaces of a substrate, and the via hole was usually filled with a metallic conductor by plating. The via hole was formed by etching the upper portion of the substrate, that is, the opposite side of a bonded surface with the base substrate. And a seed layer for use in plating the inside of the via hole is layered on the lower portion of the substrate. Therefore, during plating of the inside of the via hole, a plating material fills up the substrate.

After finishing the electrode fabrication, the upper surface of the substrate is planarized to be bonded evenly with the base substrate. At this time, it is very important that the plating material on the upper surface of the substrate does not escape from the via hole. Therefore, the plating process should be stopped when the electrode exposed to the upper surface of the substrate is still a little dented. This, of course, requires much attention. In addition, since the electrode, which is supposedly to be exposed to the upper surface of the substrate, is slightly dented, it is not easily visible. Thus, manufacturers have difficulty checking whether the plating operation has been properly carried out.

Meanwhile, in order to form a pad for coupling an electrode and an external terminal on the upper surface of the substrate, it is necessary to planarize the via hole portion where a plating material is not completely filled. Therefore, the upper surface of the substrate must be planarized further through the CMP (chemical-mechanical polishing) process. Unfortunately, however, there is a high probability for damage occurring to the circuit.

Typically, an electrode is made of copper (Cu) mainly because copper is easily oxidized. This means that a tremendous amount of attention is required for removing any oxidized site during the pad fabrication process. Furthermore, the surface of a packaging substrate is often cleaned prior to the circuit element packaging. Again, because of the highly oxidizable copper, there are not many options available for cleaning liquids except for organic solutions.

In the past, a photoresist film was usually used for patterning a via hole. However, the photoresist film shows poor corrosion resistance to an etching solution or etching gas, so that manufacturers had difficulty in patterning a micro-diameter via hole. Another problem with the traditional circuit element packaging was that a bonding layer had to be overlapped on the base substrate, and this layering process was rather complicated.

SUMMARY OF THE INVENTION

It is, therefore, an aspect of the present invention to provide a fabrication method of a packaging substrate, where a via hole is formed in a lower surface of the substrate through an etching process to simplify the fabrication, resulting in improved yield and RF characteristics, and a packaging method using the packaging substrate.

Another aspect of the present invention is to provide a fabrication method of a packaging substrate and a packaging method thereof, wherein the method makes it possible to form a micro-diameter via hole through a metal mask, and facilitates a plating process and a cleaning process.

To achieve the above aspects and advantages, there is provided a fabrication method of a packaging substrate, the method including the steps of: forming a recess by etching a predetermined area of a lower surface of a substrate; depositing a seed layer on an upper surface of the substrate; in the recess, etching a predetermined area of the lower surface of the substrate and forming at least one via hole that reaches the seed layer; and plating an inside of the via hole by using the seed layer, and forming an electrode for electrically coupling upper and lower parts of the substrate.

The method may further include the steps of: etching the seed layer and forming a first pad in a predetermined shape to be coupled to the electrode; and forming on the lower surface of the substrate a second pad in a predetermined shape to be coupled to the electrode.

The second pad may be made of metallic materials so as to be bonded to exterior materials under given conditions.

The formation of the via hole may include the steps of: depositing a metal mask on the lower surface of the substrate; etching a predetermined area of the metal mask layered on an inside of the recess; and etching the substrate in a metal mask-free area and thereby forming the at least one via hole.

During the formation of the electrode, the via hole is filled up with a plating substance in such a manner that the electrode is slightly protruded from the lower surface of the substrate beyond the bottom surface of the recess.

During the formation of the electrode, a protective layer made of predetermined materials is layered on the electrode inside the recess, and the protective layer is made of gold (Au).

Another aspect of the invention provides a circuit element packaging method, including the steps of: etching a predetermined area of a lower surface of a substrate and forming a recess; depositing a seed layer on an upper surface of the substrate; in the recess, etching a predetermined area of the lower surface of the substrate and forming at least one via hole that reaches the seed layer; plating an inside of the via hole by using the seed layer, and forming an electrode for electrically coupling upper and lower parts of the substrate; etching the seed layer and forming a first pad in a predetermined shape to be coupled to the electrode; forming on the lower surface of the substrate a second pad in a predetermined shape to be coupled to the electrode; and bonding a base substrate mounted with the circuit element to the substrate by using the second pad.

The formation of the via hole may include the steps of: depositing a metal mask on the lower surface of the substrate; etching a predetermined area of the metal mask layered on an inside of the recess; and etching the substrate in the metal mask-free area and thereby forming the at least one via hole.

During the formation of the electrode, the via hole is filled up with a plating substance in such a manner that the electrode is slightly protruded from the lower surface of the substrate beyond the bottom surface of the recess.

During the formation of the electrode, a protective layer made of predetermined materials is layered on the electrode inside the recess, and the protective layer is made of gold (Au).

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF ILLUSTRATIVE, NON-LIMITING EMBODIMENTS OF THE INVENTION

Illustrative, non-limiting embodiments of the present invention will be described herein below with reference to the accompanying drawings.

Figure 1:
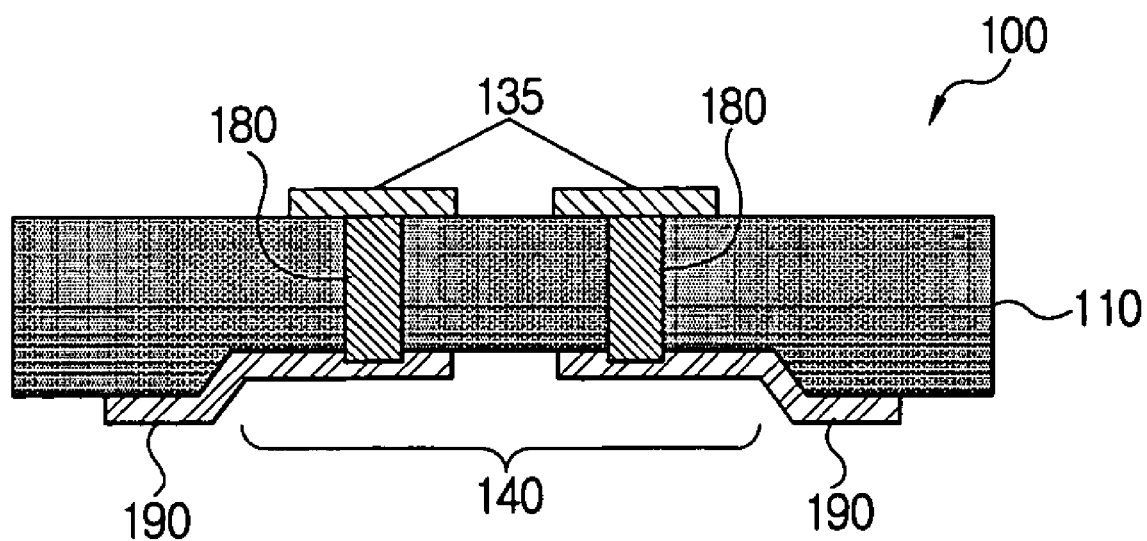
FIG. 1 is a vertical sectional view illustrating a structure of a packing substrate according to one embodiment of the present invention.

FIG. 1 is a vertical sectional view illustrating a structure of a packing substrate according to one embodiment of the present invention. Referring to FIG. 1, the packaging substrate 100 includes a substrate 110, a pair of electrodes 180, a pair of first pads 135 and a pair of second pads 190.

Part of the lower surface of the substrate 110 is etched to form a recess 140. The electrodes 180 electrically couple the first pads 135 and the second pads 190 on the upper and the lower surface of the substrate 110, respectively. Also, the electrodes 180 are formed by etching into the substrate 110 from the lower surface to create via holes, and plating the insides of the via holes. Since the recess 140 has a predetermined depth, the electrodes 180 are slightly protruded from the bottom surface of the recess 140. Since another area, except the recess 140, on the lower surface of the substrate 110 is bonded with an external base substrate (not shown), the bottom surface of the recess 140 (i.e., the surface of the substrate) does not have to be perfectly planar.

Figure 2A:
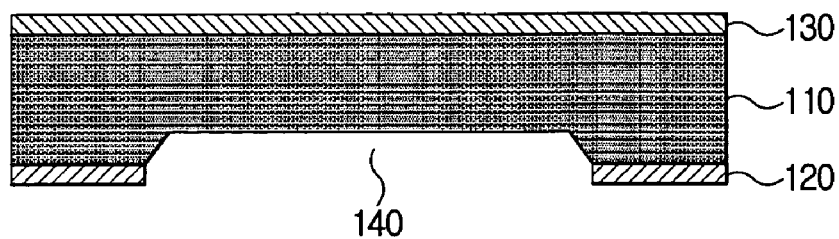
FIG. 2A to FIG. 2C are vertical sectional views for explaining a fabrication method of a packaging substrate according to one embodiment of the present invention, respectively.
Figure 2B:
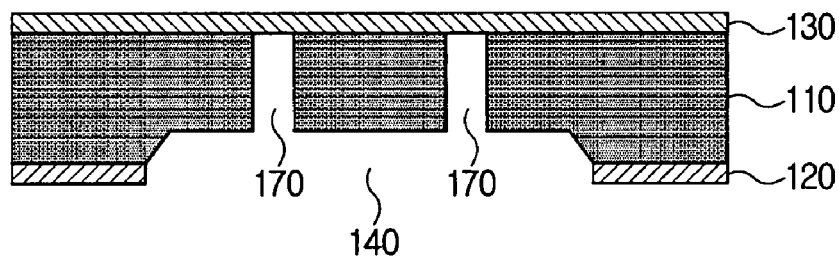
Figure 2C:
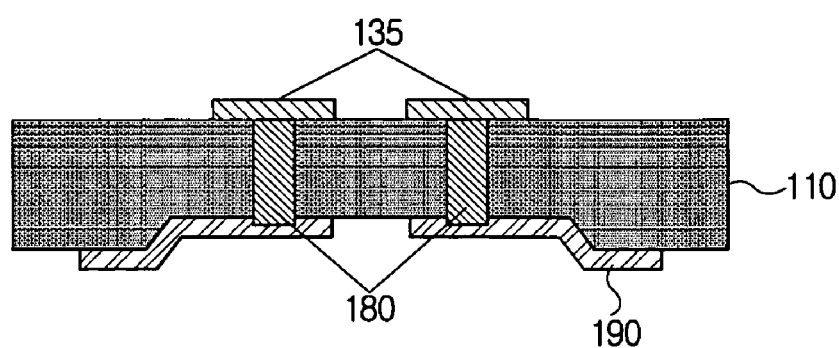

FIG. 2A to FIG. 2C are vertical sectional views for explaining a fabrication method of the packaging substrate in FIG. 1, respectively. As shown in FIG. 2A, a designated area of the lower surface of the substrate 110 is etched to form the recess 140 of a predetermined depth. And a seed layer 130 for plating is layered on the upper surface of the substrate 110.

Next, as shown in FIG. 2B, two areas of the recess 140 are etched into the substrate 110 to form a predetermined number (such as two as in the drawing) of via holes 170. The number of via holes 170 can be varied depending on the applications of the packaging substrate 100. The via holes 170 are etched into the substrate 110 from the lower surface and penetrate the substrate 110 until they reach the seed layer 130 on the upper surface of the substrate 110.

Lastly, as shown in FIG. 2C, the insides of the via holes 170 are plated to form the electrodes 180 which connect first pads 135 to second pads 190.

Figure 3A:
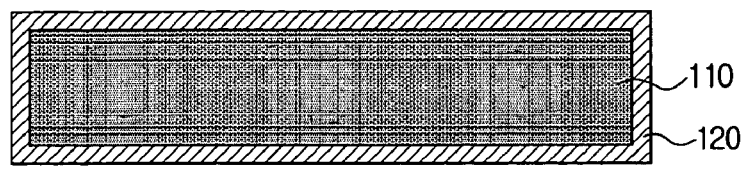
FIG. 3A to FIG. 3E are vertical sectional views for explaining a recess forming step in a packaging substrate fabrication method according to one embodiment of the present invention, respectively.

FIG. 3A to FIG. 3E are vertical sectional views for explaining in more detail the process illustrated in FIG. 2A. As depicted in FIG. 3A, in order to form the recess 140, the whole surface of the substrate 110 is oxidized to form an oxide film 120. The typical example of the substrate 110 is a high-resistance silicon substrate.

Figure 3B:
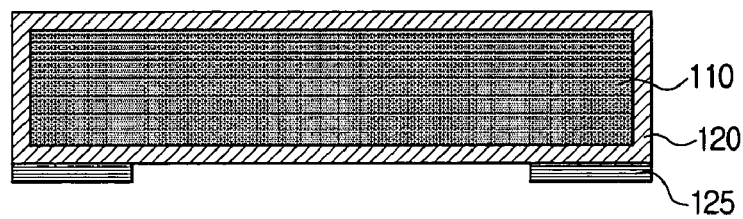

Next, as shown in FIG. 3B, a photoresist film 125 in a designated shape is layered on predetermined areas of the oxide film 120 on the lower surface of the substrate 110.

Figure 3C:
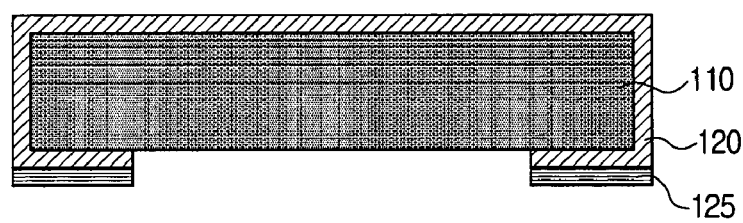

Then, as shown in FIG. 3C, the area of the oxide film 120 that is not overlayered with the photoresist film 125 is etched.

Figure 3D:
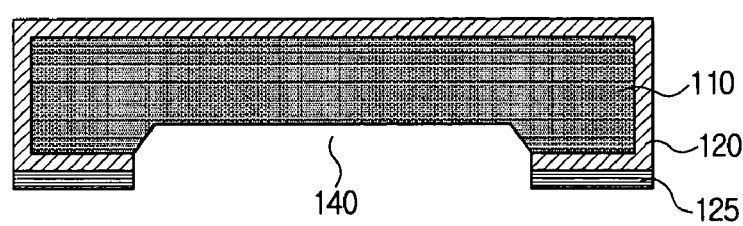

Referring now to FIG. 3D, the oxide film 120—free area of the substrate 110 is etched to a predetermined depth to form the recess 140. As for etching the substrate 110, either a dry etching or wet etching is used.

Figure 3E:
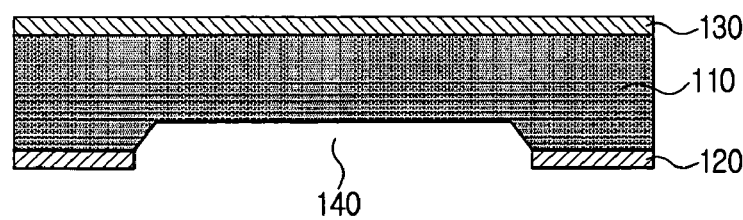

Lastly, as shown in FIG. 3E, the oxide film 120 and the photoresist film 125 are removed from the upper surface and the sides of the substrate 110, respectively, and the seed layer 130 is layered on the upper surface of the substrate 110 instead.

Figure 4A:
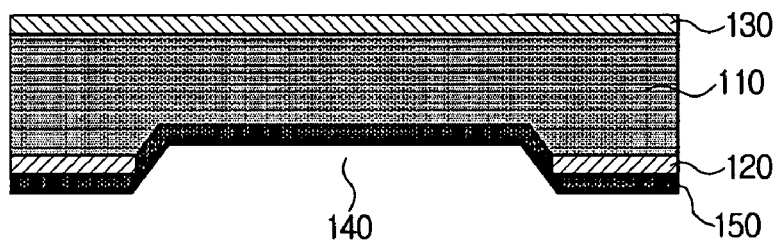
FIG. 4A to FIG. 4D are vertical sectional views for explaining a via hole forming step in a packaging substrate fabrication method according to one embodiment of the present invention, respectively.

FIG. 4A to FIG. 4D are vertical sectional views for explaining in more detail the process illustrated in FIG. 2B. As shown in FIG. 4A, the whole lower surface of the substrate 110 is covered with a metal mask 150. That is, the metal mask 150 is layered on the surface of substrate 110 in and around the recess 140.

Figure 4B:
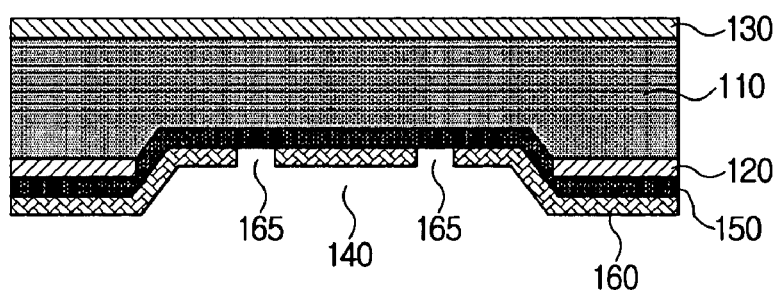

Next, as shown in FIG. 4B, a photoresist film 160 is layered again on the designated areas of the metal mask 150 in such manner that some parts of the metal mask 150 on the recess 140 are exposed.

Figure 4C:
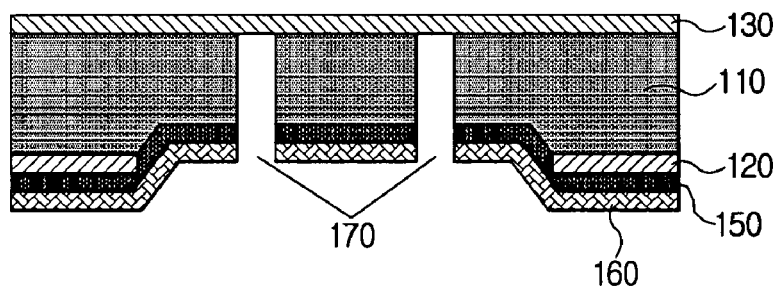

FIG. 4C illustrates that the exposed parts of the metal mask 150 are etched into the substrate 110 from bottom to top, and the via holes 170 are formed. Taking advantage of a fact that the metal mask 150 is more corrosion resistive to etching than the photoresist film 160, one can create via holes 170 less than 60 μm in diameter.

Figure 4D:
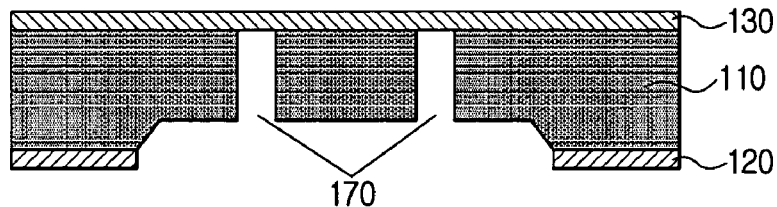

Lastly, as shown in FIG. 4D, the metal mask 150 and the photoresist film 160 are removed from the lower surface of the substrate 110.

Figure 5A:
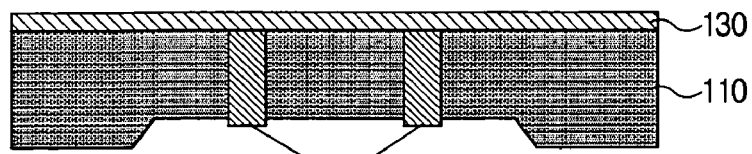
FIG. 5A to FIG. 5E are vertical sectional views for explaining an electrode and a pad forming step in a packaging substrate fabrication method according to one embodiment of the present invention, respectively.

FIG. 5A to FIG. 5E are vertical sectional views for explaining in more detail the process illustrated in FIG. 2C. As shown in FIG. 5A, a plating process is performed by using the seed layer 130 on the upper surface of the substrate 110 to fill up the via holes 170. Thus, the electrodes 180 for electrically coupling the upper and the lower part of the substrate 110 are produced. Here, the plating process takes place in a top-down direction, namely, from the seed layer 130 on the upper surface of the substrate 110 to the lower surface of the substrate 110 inside of the recess 140. When the via holes 170 are completely filled with a plating substance, the electrodes 180 are slightly protruded from the bottom surface of the recess 140. Because the recess 140 itself is formed in predetermined depth, the slightly protruded electrodes 180 do not affect bonding. In this manner, it becomes much easier to see from outside whether the plating process has been properly executed. Moreover, since the interior surface of the recess 140 does not have to be perfectly planar, the plating process becomes very simple and easy, compared with the traditional ones.

Figure 5B:
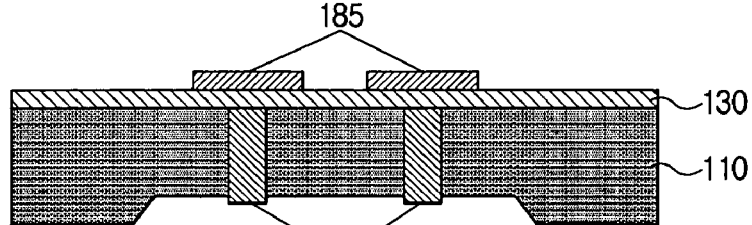
Figure 5C:
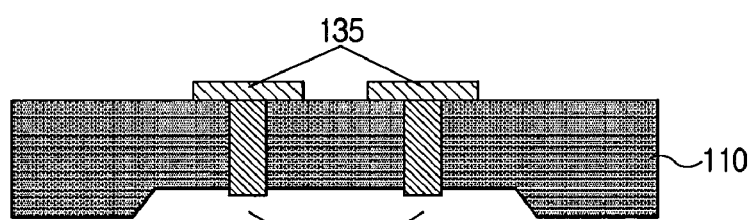

Next, as shown in FIG. 5B, photoresist films 185 in a designated shape are layered on the upper surface of the seed layer 130. Later, as shown in FIG. 5C, the seed layer 130 is etched to form the first pads 135 that are electrically coupled with the electrodes 180.

Figure 5D:
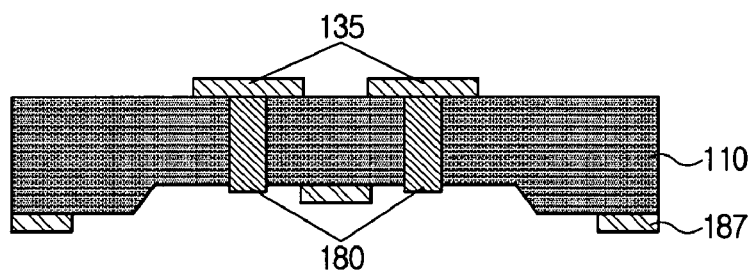
Figure 5E:
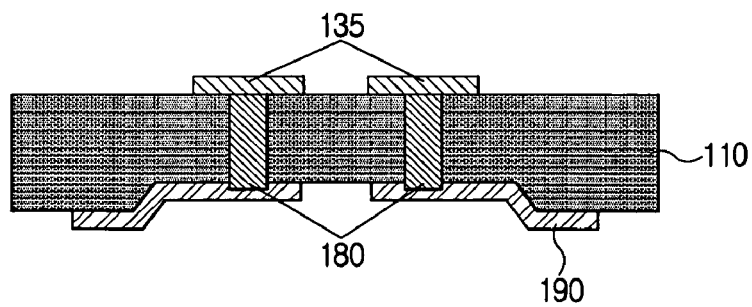

Similarly, as shown in FIG. 5D, photoresist films 187 in a designated shape are layered on the lower surface of the substrate 110. And, as shown in FIG. 5E, the second pads 190 that are electrically coupled with the electrodes 180 are formed. Typically, the second pads 190 are made of metallic materials. Using the eutectic bonding, predetermined temperature and pressure are applied to the second pads 190 to bond the packaging substrate 110 to the base substrate (not shown). In other words, it is not necessary to form an additional metal layer for electrical coupling with the electrodes 180. Alternatively, by changing the pattern of the photoresist film 187 in FIG. 5D, it is possible to layer metallic materials on the edges of the lower surface of the substrate 110 during formation of the second pads 190. Thusly layered metal layer reinforces the bonding effect between the packaging substrate and the base substrate, and further it can seal the circuit completely.

Figure 6:
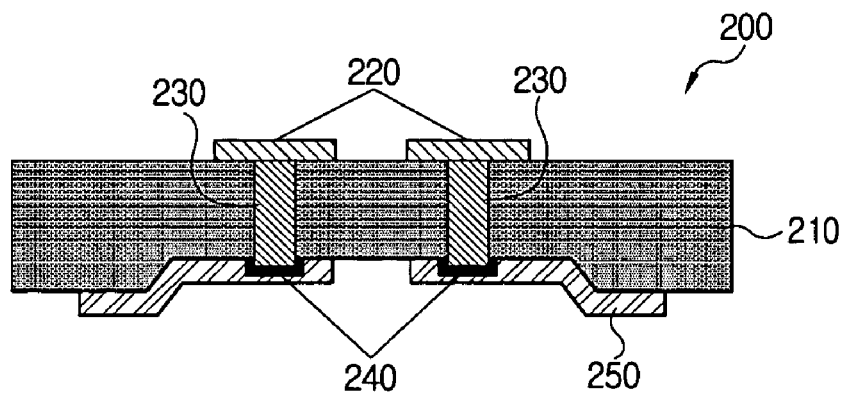
FIG. 6 is a vertical sectional view illustrating a structure of a packaging substrate according to another embodiment of the present invention.

FIG. 6 is a vertical sectional view illustrating a structure of a packaging substrate according to another embodiment of the present invention. Referring to FIG. 6, the packaging substrate 200 includes a substrate 210, a pair of electrodes 230, a pair of first pads 220, a pair of second pads 250, and a pair of protective layers 240.

The protective layer 240 prevents the electrodes 230 from being exposed to the outside and being oxidized, and facilitates a cleaning process. The protective layer 240 is formed by covering the electrodes 230 with weakly ionizable or unionizable substances during the plating process. An example of unionizable substances for protecting the electrodes 230 is gold (Au). This feature gives more options for cleaning liquids. Since the electrodes 230 are well protected by gold, organic as well as acidic solutions can be used for cleaning the packaging substrate 200. Furthermore, since the electrodes are no longer exposed to air, it becomes much easier to form the second pads 250 on the lower surface of the substrate 210. The rest of constitutional elements and their functions are identical with those in FIG. 6.

Figure 7:
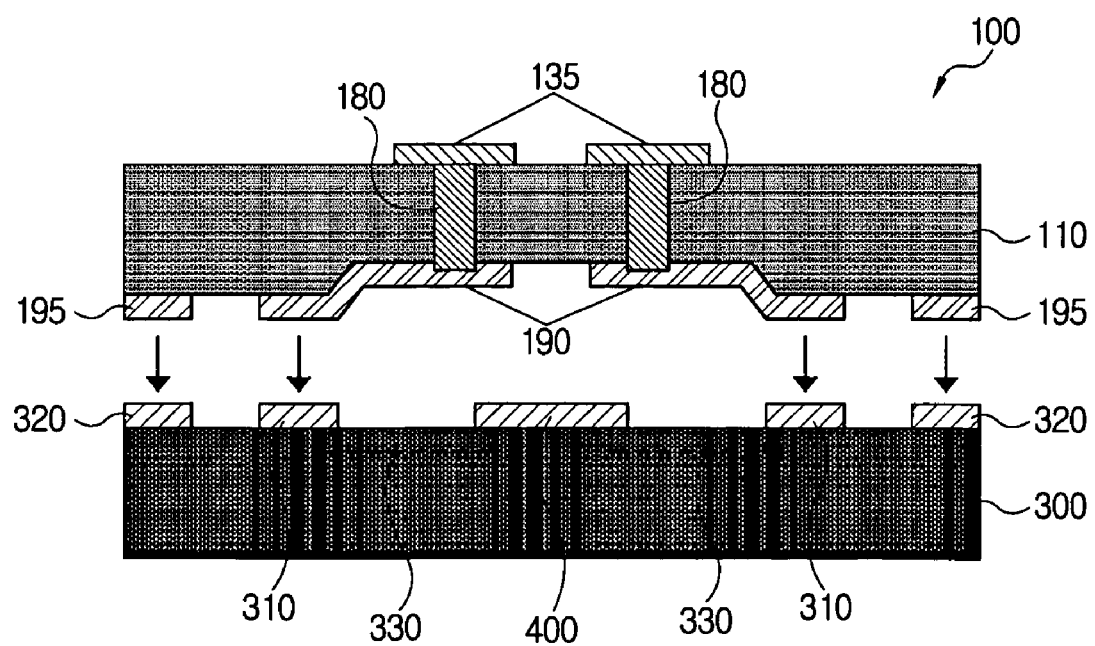
FIG. 7 is a vertical sectional view for explaining a packaging method of a circuit element using a packaging substrate in FIG. 1.

FIG. 7 is a vertical sectional view for explaining a packaging method of a circuit element 400 by using the packaging substrate 100 in FIG. 1. Referring to FIG. 7, the circuit element 400 is mounted on a base substrate 300 and sealed by the packaging substrate 100. Here, the edges of the lower surface of the packaging substrate 100 are layered with metal layers 195 to make sure that the circuit element 400 is perfectly sealed. As aforementioned, the metal layer 195 can be formed during the formation of second pads 190.

In addition to the circuit element 400, the base substrate 300 further includes a pair of first bonding layers 310, a pair of second bonding layers 320 and connecting lines 330. The first bonding layers 310 are bonded to the second pads 190 on the lower surface of the packaging substrate 100, and the second bonding layers 320 are bonded to the metal layers 195 on the lower surface of the packaging substrate 100. Meanwhile, the circuit element 400 is connected to the first bonding layers 310 through the connecting lines 330 that are built in the base substrate 300. When the packaging substrate 100 is bonded to the base substrate 300, the circuit element 400 is automatically connected to an external terminal (not shown) through the connecting lines 330, the first bonding layers 310, the second pads 190, the electrodes 180 and the first pads 135. Although the connecting lines 330 are formed inside the base substrate 300 as shown in FIG. 7, they can also be formed on the surface of the base substrate 300 in a predetermined pattern. In addition, the circuit element 400 can be connected to the surface of the base substrate 300 as shown in FIG. 7, or mounted in the base substrate 300.

In conclusion, the present invention can be advantageously used for simplifying the fabrication method of the packaging substrate and reducing damage to the circuit element during the fabrication. This in turn increases the yield. In detail, the plating process becomes easier because the insides of the via holes formed in the recess are plated. Also, it is not necessary to perform the CMP process, so that the entire fabrication process can be simplified and the circuit element can be protected from damage. Furthermore, the protective layer made of gold facilitates the cleaning process by protecting the electrodes. The simplified fabrication results in the improved bonding effects and improved RF characteristics.

The foregoing embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A fabrication method of a packaging substrate, the method comprising the steps of:
    forming a recess by etching a predetermined area of a lower surface of a substrate;
    depositing a seed layer on an upper surface of the substrate;
    in the recess, etching a predetermined area of the lower surface of the substrate and forming at least one via hole that reaches the seed layer; and
    plating an inside of the via hole by using the seed layer, and forming an electrode for electrically coupling upper and lower parts of the substrate.

2. The method according to claim 1, further comprising the steps of:

etching the seed layer and forming a first pad in a predetermined shape to be coupled to the electrode; and forming on the lower surface of the substrate a second pad in a predetermined shape to be coupled to the electrode.

3. The method according to claim 2, wherein the second pad is made of metallic materials so as to be bonded to exterior materials under given conditions.

4. The method according to claim 1, wherein the formation of the via hole comprises the steps of:

depositing a predetermined metal mask on the lower surface of the substrate;

etching a predetermined area of the metal mask layered on an inside of the recess; and etching the substrate in a metal mask-free area and thereby forming the at least one via hole.

5. The method according to claim 1, wherein, during the formation of the electrode, the via hole is filled up with a plating substance in such a manner that the electrode is slightly protruded from the lower surface of the substrate beyond the bottom surface of the recess.

6. The method according to claim 5, wherein, during the formation of the electrode, a protective layer made of predetermined materials is layered on the electrode inside the recess.

7. The method according to claim 6, wherein the protective layer is made of gold (Au).

8. A circuit element packaging method, comprising the steps of:

etching a predetermined area of a lower surface of a substrate and forming a recess;

depositing a seed layer on an upper surface of the substrate;

in the recess, etching a predetermined area of the lower surface of the substrate and forming at least one via hole that reaches the seed layer;

plating an inside of the via hole by using the seed layer, and forming an electrode for electrically coupling upper and lower parts of the substrate;

etching the seed layer and forming a first pad in predetermined shape to be coupled to the electrode;

forming on the lower surface of the substrate a second pad in a predetermined shape to be coupled to the electrode; and bonding a base substrate mounted with the circuit element to the substrate by using the second pad.

9. The method according to claim 8, wherein the formation of the via hole comprises the steps of:

depositing a metal mask on the lower surface of the substrate;

etching a predetermined area of the metal mask layered on an inside of the recess; and etching the substrate in the metal mask-free area and thereby forming the at least one via hole.

10. The method according to claim 8, wherein, during the formation of the electrode, the via hole is filled up with a plating substance in such a manner that the electrode is slightly protruded from the lower surface of the substrate beyond the bottom surface of the recess.

11. The method according to claim 10, wherein, during the formation of the electrode, a protective layer made of predetermined materials is layered on the electrode inside the recess.

12. The method according to claim 11, wherein the protective layer is made of gold (Au).

* * * * *